United States Patent
Wu et al.

(10) Patent No.: US 9,040,315 B2
(45) Date of Patent: May 26, 2015

(54) METHOD FOR PLANARIZING SEMICONDUCTOR DEVICES

(71) Applicant: UNITED MICROELECTRONICS CORPORATION, Hsinchu (TW)

(72) Inventors: Yi-Ching Wu, Hsinchu County (TW); Tzu-Hung Yang, Hsinchu (TW); Chih-Chung Wu, Taipei (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 13/921,220

(22) Filed: Jun. 19, 2013

(65) Prior Publication Data

US 2014/0377887 A1    Dec. 25, 2014

(51) Int. Cl.
*H01L 21/306* (2006.01)
*H01L 21/66* (2006.01)

(52) U.S. Cl.
CPC ........... *H01L 21/30625* (2013.01); *H01L 22/26* (2013.01); *H01L 22/12* (2013.01)

(58) Field of Classification Search
CPC ............ H01L 21/302; H01L 21/02065; H01L 21/31051; H01L 21/31053
See application file for complete search history.

(56) References Cited

U.S. PATENT DOCUMENTS

| | | | |
|---|---|---|---|
| 5,665,199 A * | 9/1997 | Sahota et al. | 438/14 |
| 6,506,097 B1 | 1/2003 | Adams | |
| 6,632,124 B2 | 10/2003 | Adams | |
| 6,638,866 B1 | 10/2003 | Cheng | |
| 7,087,528 B2 | 8/2006 | Cheng | |
| 2004/0009655 A1 * | 1/2004 | Jung | 438/622 |
| 2006/0135051 A1 * | 6/2006 | Meyer et al. | 451/538 |
| 2008/0261402 A1 * | 10/2008 | Lu et al. | 438/693 |
| 2014/0162446 A1 * | 6/2014 | Lin et al. | 438/585 |

OTHER PUBLICATIONS

Shin, Woonki, Park, Sungmin; Kim, Hyoungjae; Park, Kihyun; Joo, Sukbae; Jeong, Haedo, Reduction of Dishing in Polysilicon CMP for MEMS Application by Using protective Layer and High Selectivity, Planarization / CMP Technology (ICPT), 2007 international Conference on, Oct. 25-27, 2007, p. 1-5, Conference Publications, Dresden, Germany.

* cited by examiner

*Primary Examiner* — Yu-Hsi D Sun
(74) *Attorney, Agent, or Firm* — Ding Yu Tan (57) ABSTRACT

A method for planarizing semiconductor devices, wherein the method comprises steps as follows: At least one patterned metal layer is formed on a substrate. A material layer having a first area and a second area is provided on the patterned metal layer and the substrate, in which there is a step height existing between the first area and the second area. A first polishing process having a first selection ratio of relative speeds for removing the material layer at the first area to that at the second area is then performed on the material layer. Subsequently, a second polishing process having a second selection ratio of relative speeds for removing the material layer at the first area to that at the second area is performed on the material layer, and the second selection ratio is greater than the first selection ratio.

10 Claims, 6 Drawing Sheets

METHOD FOR PLANARIZING SEMICONDUCTOR DEVICES

FIELD OF THE INVENTION

The present invention relates to a method for fabricating semiconductor devices, and more particularly to a method for planarizing semiconductor devices.

BACKGROUND OF THE INVENTION

A semiconductor integrated circuit is typically formed on a substrate by the sequential deposition of conductive, semiconductor or insulation material layers on a silicon wafer. After each material layer is deposited, the material layer is etched to create circuitry features. As a series of material layers are sequentially deposited and etched, the outer or uppermost surface of the semiconductor integrated circuit, i.e., the exposed surface of the material layer becomes increasingly non-planar. This non-planar surface presents problems in the photolithographic steps of the semiconductor integrated circuit fabrication process. Therefore, there is a need to periodically planarize the exposed material layers.

Chemical mechanical polishing (CMP) process is one accepted method of planarization. This planarization method typically requires polishing slurry, including at least one chemically reactive agent, and abrasive particles supplied to the exposed surface of the material layer against a rotating polishing pad. However, there are problems and drawbacks in CMP process, for example, since variations found in the initial thickness of the material layers, the slurry composition, the polishing pad condition, the relative removing speeds between the polishing pad and the different material layers, and the load on the substrate can cause variations in the material removal rate, thus it is difficult to determine whether the polishing process has reached completion, i.e., whether a material layer has been planarized to a desired flatness or thickness in order to globally planarize the semiconductor integrated circuit, whereby merely a local planarization of semiconductor integrated circuit is thereby accomplished, and step height that may adversely effect the performance of the subsequent process for fabricating the semiconductor integrated circuit occurs between the local planarization area and the peripheral area that is not equally or sufficiently planarized.

Therefore, there is a need of providing an improved method for planarizaing semiconductor devices to obviate the drawbacks encountered from the prior art.

SUMMARY OF THE INVENTION

In accordance with one aspect, the present invention provides a method for planarizing semiconductor devices, wherein the method comprises steps as follows: A material layer having a first area and a second area is firstly provided, wherein there is a step height existing between the first area and the second area. A first polishing process is then performed on the material layer, wherein the first polishing process has a first selection ratio of relative speeds for removing the material layer at the first area to that at the second area. Subsequently, a second polishing process is performed on the material layer, wherein the second polishing process has a second selection ratio of relative speeds for removing the material layer at the first area to that at the second area, and the second selection ratio is greater than the first selection ratio.

In one embodiment of the present invention, the first polishing process comprises a first slurry having silicon dioxide ($SiO_2$) ranging from 0.95% to 1.05% by weight.

In one embodiment of the present invention, the first selection ratio is about 1:7.

In one embodiment of the present invention, the second polishing process comprises a second slurry having cerium dioxide ($CeO_2$) ranging from 1.45% to 1.85% by weight.

In one embodiment of the present invention, the second slurry further comprises a buffer reagent ranging from 0.95% to 1.05% by weight.

In one embodiment of the present invention, the buffer reagent comprises a chemical activator, an inhibitor polymer or a combination thereof.

In one embodiment of the present invention, the second selection ratio is about 1:30.

In one embodiment of the present invention, each of the first polishing process and the second polishing process utilizing an optical monitoring system to determine an end-point corresponding to the first polishing process and the second polishing process, respectively.

In one embodiment of the present invention, the first polishing process is ended when the step height is reduced by half.

In one embodiment of the present invention, the second polishing process is ended when the step height is equal to or reduced to 0.

In one embodiment of the present invention, the first polishing process is terminated or ended after the first polishing process has lasted or endured for a predetermined first polishing time.

In one embodiment of the present invention, the second polishing process is end after the second polishing process has lasted or endured for a predetermined second polishing time.

In one embodiment of the present invention, the material layer is a dielectric layer formed on a substrate.

In one embodiment of the present invention, the step of providing the material layer further comprises forming a patterned metal layer between the dielectric layer and the substrate.

In accordance with the aforementioned embodiments of the present invention, a method for planarizing a semiconductor device is provided, wherein at least two polish processes using different slurries are performed to planarize a material layer of a semiconductor device that has a first area, a second area and a step height existing there between, wherein the first polishing process has a first selection ratio of relative speeds for removing the material layer at the first area to that at the second area, and a second selection ratio of relative speeds for removing the material layer at the first area to that at the second area; and the second selection ratio is greater than the first selection ratio.

Since most of the material layer can be rapidly removed by the first polishing process having a lower selection ratio for removing the material layer at the first area and at the second area, respectively; and the step height existing between the first area and the second area can be diminished or lowered by the second polishing process having a higher selection ratio for removing the material layer at the first area and at the second area, respectively, thus the processing time can be significantly reduced, and the end point of the planarization can be determined more easily in comparison with the traditional planarization process. Accordingly, the material layer can be globally planarized, and the performance of the subsequent process for forming the semiconductor devices can be improved.

In addition, because it is not necessary to form a polishing stop layer to determine whether the polishing process is complete, thus the processing cost can be reduced due to the omission of steps and material for forming the same.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

A method for planarizing semiconductor devices is provided by the present invention to globally planarize a material layer of a semiconductor device, whereby the subsequent process for forming the semiconductor devices can be improved. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A-1D are cross-sectional views of the processing structures for fabricating a semiconductor device 100 in accordance with one embodiment of the present invention, wherein the method for fabricating a semiconductor device 100 comprises steps as follows:

Firstly, a substrate 101 having at least one patterned metal layer 102 and at least one material layer 103 formed thereon is provided. In some embodiments of the present invention, the substrate 101 is a silicon substrate. The patterned metal layer 102 comprises a plurality of openings 102a used to expose the substrate 101 in order to define a plurality of metal lines 102b serving as interconnections of the semiconductor device 100 on the substrate 101. The material layer 103 is a dielectric layer that is blanketed over the substrate 101 and the patterned metal layer 102. In the present embodiment, the material layer 103 is made of silicon dioxide deposited on and conforms to the substrate 101 and the patterned metal layer 102. Because the patterned metal layer 102 formed on the substrate 101 has an uneven topography, thus the material layer 103 conforming to the patterned metal layer 102 also has an uneven topography (see FIG. 1A).

Figure 1A:
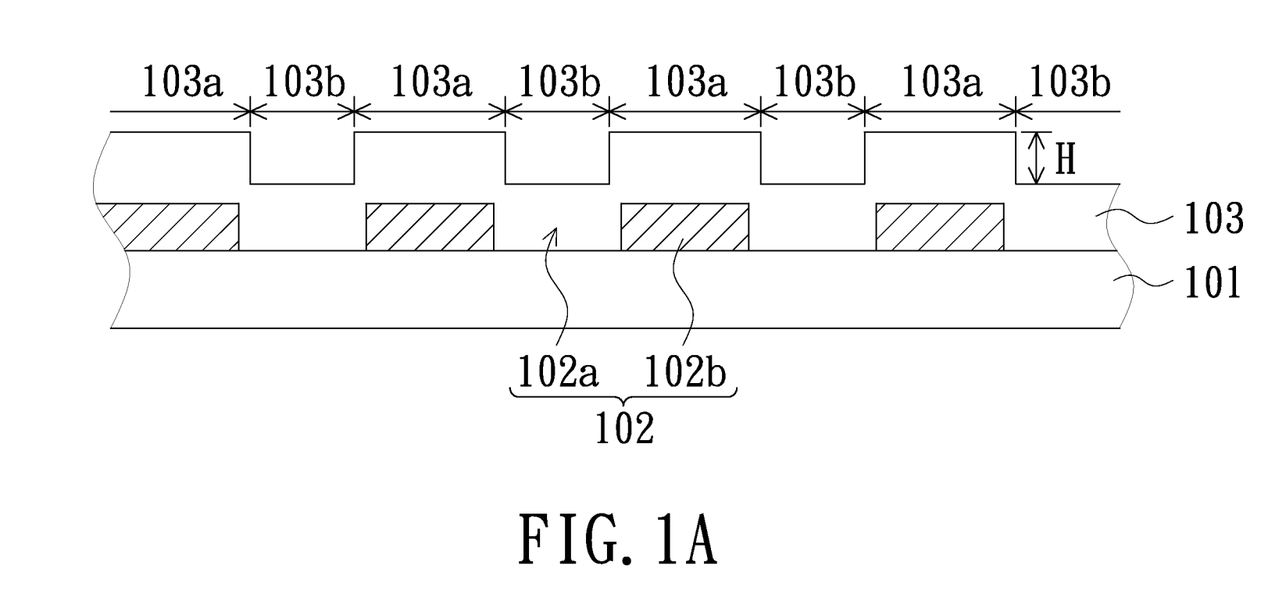
FIGS. 1A-1D are cross-sectional views of the processing structures for fabricating a semiconductor device in accordance with one embodiment of the present invention.

In some embodiments, the material layer 103 with the uneven topography can be divided into at least two areas, and there is a step height that exists between these at least two areas. For example, in the present embodiment, the portion of the material layer 103 overlying on the metal lines 102b is referred as to a first area 103a, and the portion of the material layer 103 overlying on the openings 102a is referred as to a second area 103b, and there exists a step height H, i.e. the height difference measured from the top surface of the material layer 103 to the base of the material layer 103 at between the first area 103a and the second area 103b. Since this non-planar surface of the material layer 103 may present problems in the subsequent photolithographic steps for fabricating the semiconductor device 100, thus a planarization process is required.

Figure 3:
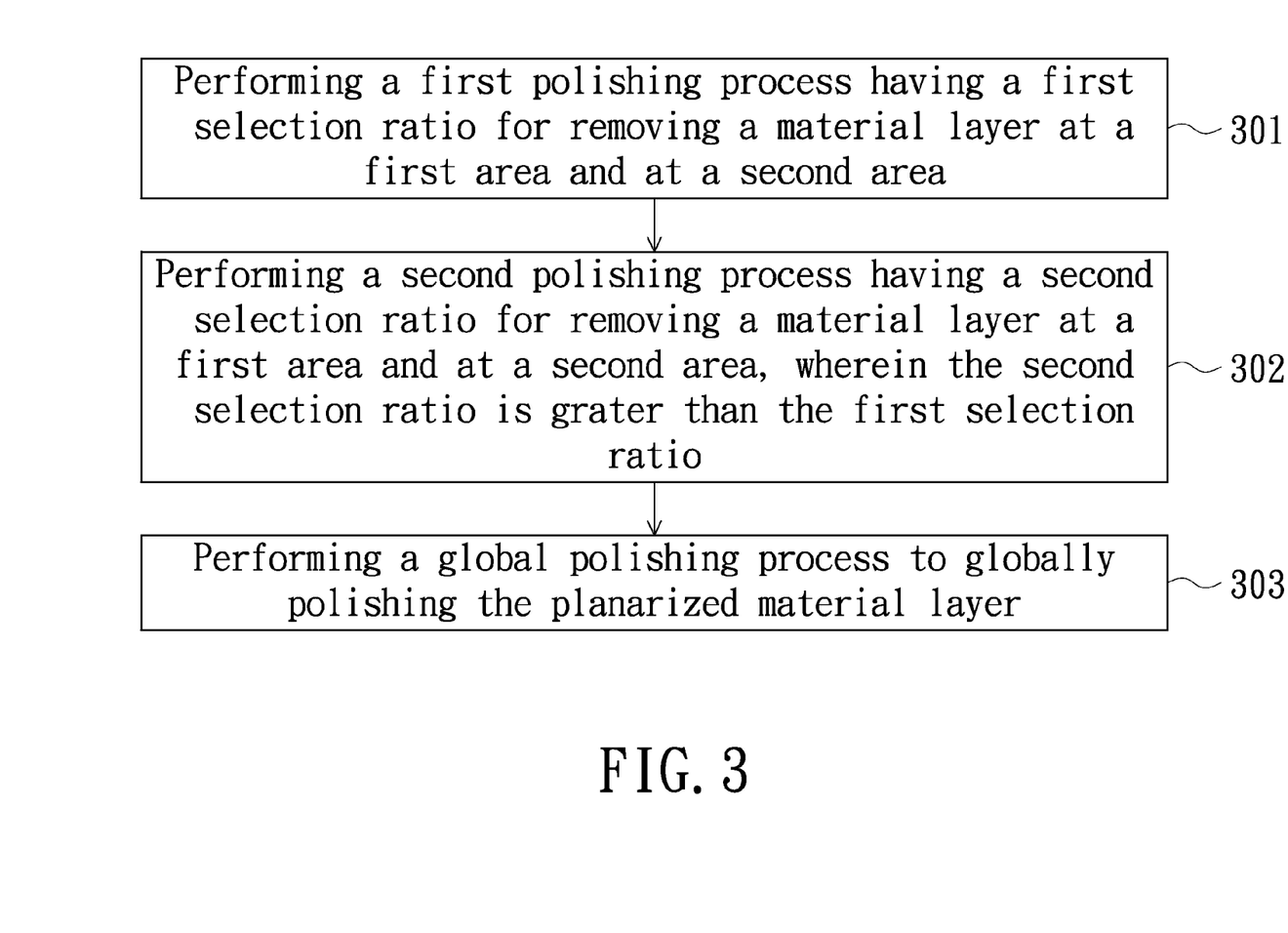
FIG. 3 is a block diagram illustrating a planarization process for diminishing or reducing a step height existing between a first area and a second area of a material layer in accordance with one embodiment of the present invention.

FIG. 3 is a block diagram illustrating a planarization process for reducing the step height H which exists between the first area 103a and the second area 103b of the material layer 103 in accordance with one embodiment of the present invention.

Figure 1B:
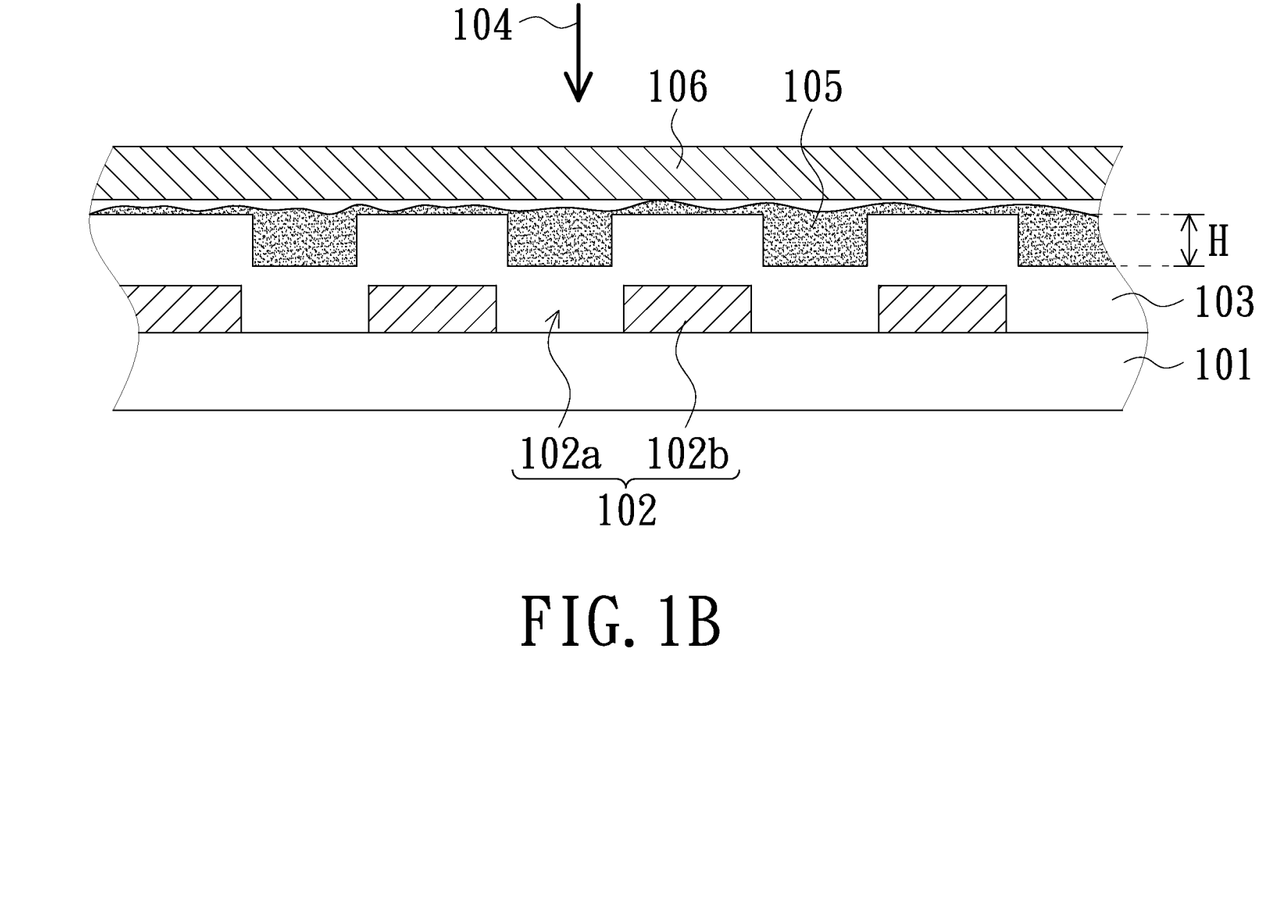

Referring to step 301, a first polishing process 104 having a first selection ratio for removing the material layer 103 at the first area 103a and at the second area 103b, respectively, is performed on the material layer 103 (see FIG. 1B). In some embodiments of the present invention, the first polishing process 104 has different speeds for removing the material layer 103 at the first area 103a and at the second area 103b, wherein the ratio of the relative speeds for removing the material layer 103 at the first area 103a to that at the second area 103b is referred as to a first selection ratio.

The first polishing process 104 preferably is a CMP process utilizing slurry 105 having silicon dioxide ($SiO_2$) supplied to an exposed surface of the material layer 103 against a rotating polishing pad 106. In the present embodiment, the slurry 105 utilized by the first polishing process 104 comprises $SiO_2$ ranging from 0.95% to 1.05% by weight, and the first selection ratio is about 1:7.

During the first polishing process 104, an end-point determining step is performed to determine whether the first polishing process 104 is completed. In some embodiments of the present invention, the step height H that is diminished or reduced gradually by the first polish process 104 may serve as a reference in determining the endpoint of the first polishing process 104. For example, in one embodiment of the present invention, the first polishing process 104 is ended when half of the step height H (measured at the start thereof) is reduced by polishing.

In some embodiments of the present invention, the remaining step height H can be estimated by considering the correlation between the polishing time of the first polishing process 104 and its polishing speed (removal rate) for removing the material layer 103 at the first area 103a. As a result, the endpoint of the first polishing process 104 can be determined by referencing the estimated step height H. In the present embodiment, the first polishing process 104 is ended after the first polishing process 104 lasting for a predetermined first polishing time upon when the step height H is removed by half.

Alternatively, in some other embodiment (see FIG. 2), an optical monitoring system 200 includes a light source 201 and a light detector 202 is adapted to detect the thickness of the material layer 103 and/or the remaining step height H in determining the endpoint of the first polishing process 104. A spectrum of white light 203 provided from the light source 201, passing through an optical access 204, such as an aperture or a window formed through the polishing pad 206, is reflected from the material layer 103 back through the optical access 204, and travels to the light detector 202; the thickness of the material layer 103 and/or the remaining step height H can be estimated by measuring the spectrum of white light 203 received by the light detector 202. As a result, the endpoint of the first polishing process 104 can be determined by referencing the step height H. Since, the method for estimating a thickness of a polished layer has been well known, thus the detailed steps for performing the same will not be redundantly described, and for clarification and brevity, identical elements are designated by identical numeral references.

Figure 1C:
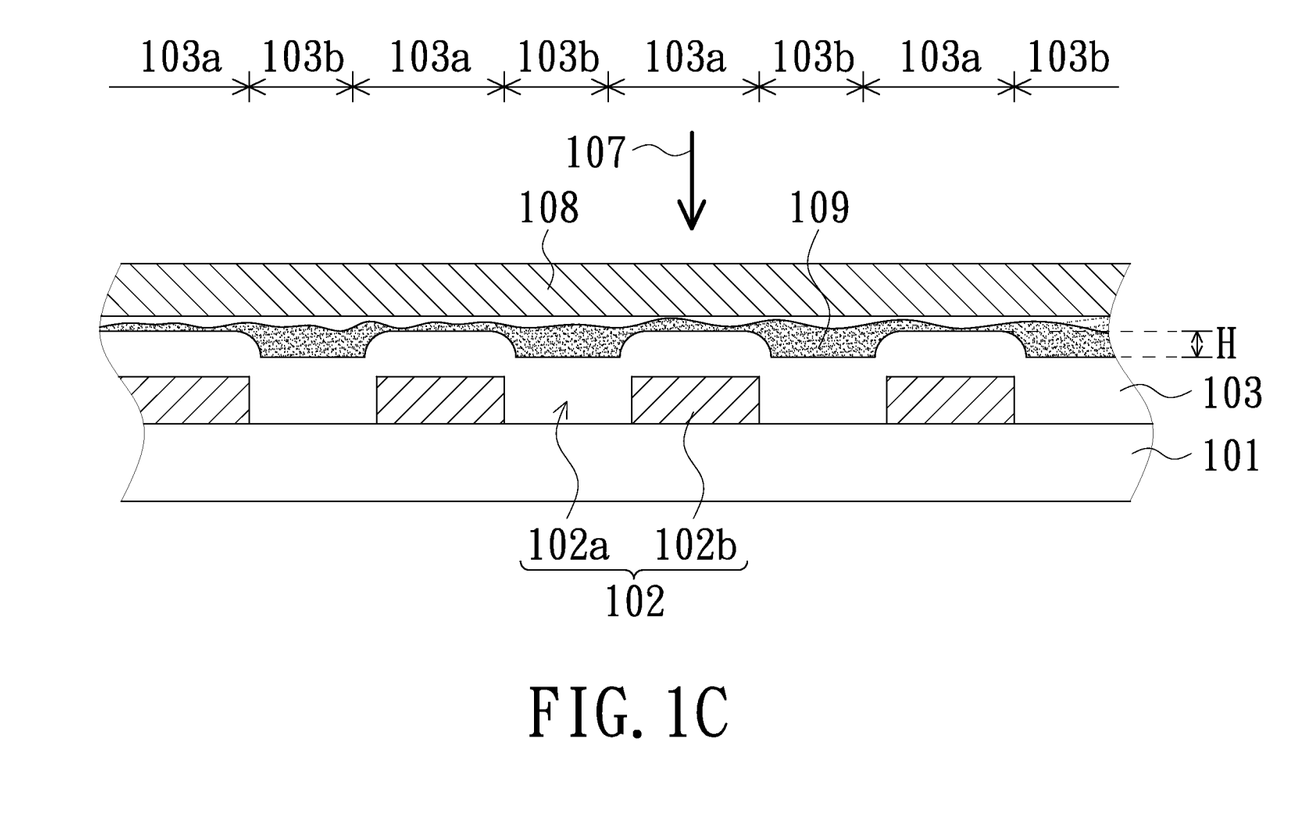
Figure 1D:
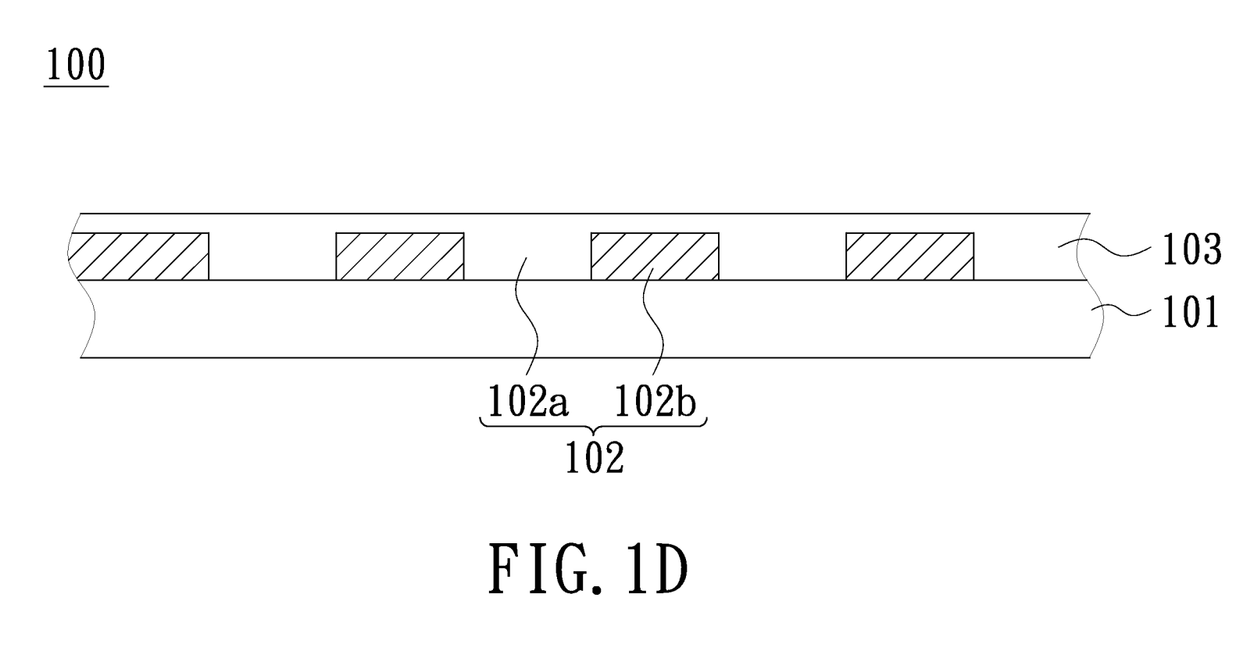

Referring to step 302 of FIG. 3, a second polishing process 107 having a second selection ratio for removing the material layer 103 at the first area 103a and at the second area 103b, respectively, is performed on the material layer 103 (also see FIG. 1C). In some embodiments of the present invention, the second polishing process 107 has different speeds for removing the material layer 103 located at the first area 103a and at the second area 103b, wherein the ratio of the relative speeds for removing the material layer 103 at the first area 103a to that at the second area 103b is referred as to a second selection ratio, wherein the second selection ratio of the second polishing process 107 is greater than the first selection ratio of the first polishing process 104.

The second polishing process 107 preferably is a CMP process utilizing slurry 109 having cerium dioxide (CeO2) supplied to the exposed surface of the material layer 103 against a rotating polishing pad 108. In some embodiments of the present invention, the slurry 109 utilized by the second polishing process 107 comprises CeO2 ranging from 1.45% to 1.85% by weight. In the present embodiment, the second polishing process 107 further comprises a buffer reagent ranging from 0.95% to 1.05% by weight. The buffer reagent preferably comprises a re-dispersible polymer. In the present embodiment, buffer reagent comprise cAiPTM provided by Du Pont Air Products NanoMaterials L.L.C., and the second selection ratio is about 1:30.

During the second polishing process 107, an end-point determining step is performed to determine whether the second polishing process 107 is completed. In the embodiments of the present invention, the step height H that is diminished or reduced gradually by the second polish process 107 may serve as a reference in determining the endpoint of the second polishing process 107. For example, in one embodiment of the present invention, the second polishing process 107 is ended until when the step height H is equal to 0.

In one embodiments of the present invention, the remaining step height H can be estimated by considering the correlation between the polishing time of the second polishing process 107 and its polishing speed (removal rate) for removing the material layer 103 at the first area 103a. As a result, the endpoint of the second polishing process 107 can be determined by referencing the estimated step height H. In the present embodiment, the second polishing process 107 is ended after lasting for a predetermined second polish time until when the step height H is equal to 0.

Figure 2:
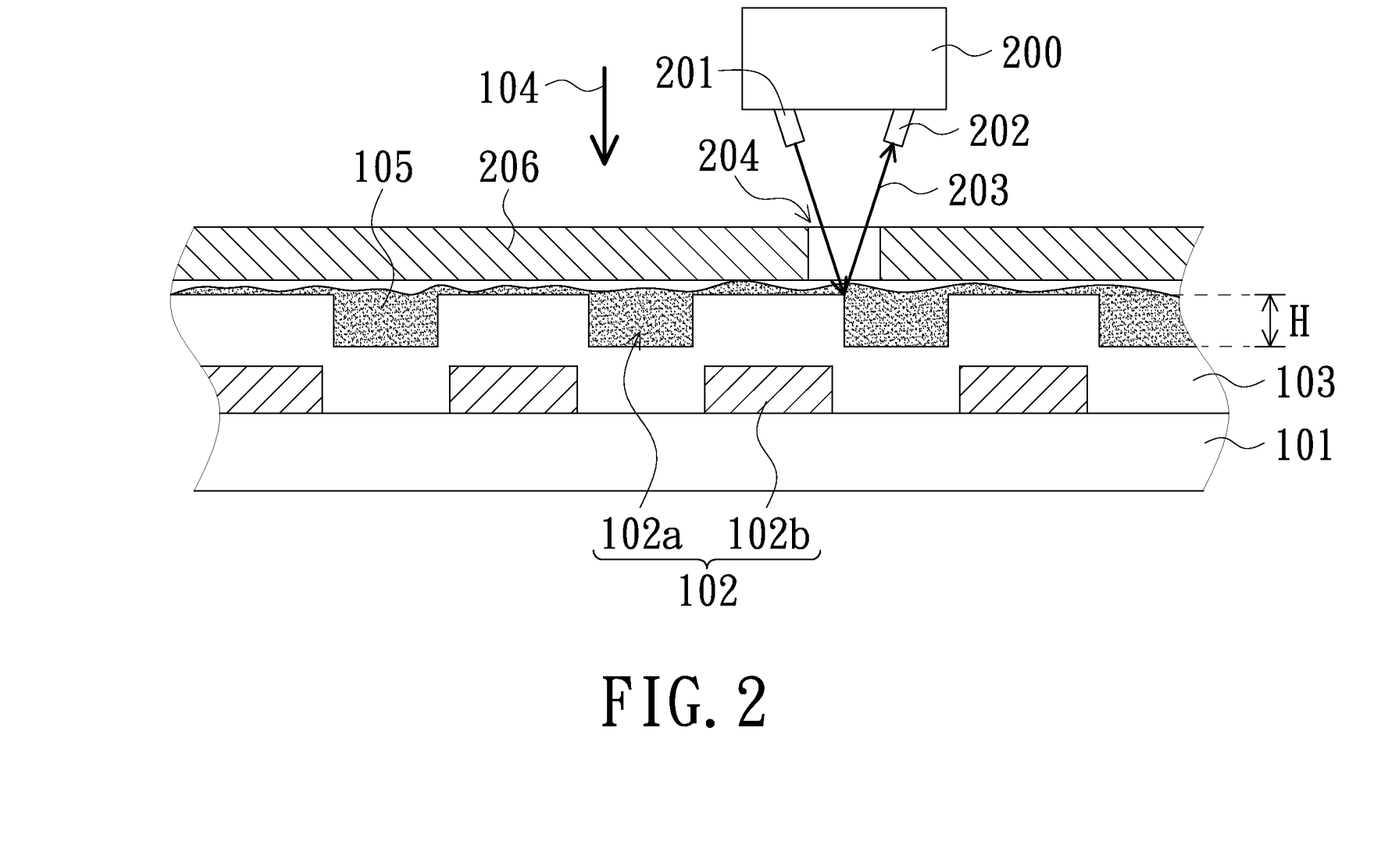
FIG. 2 illustrates a cross-sectional view of an optical monitoring system adapted to determine an endpoint of a polishing process in accordance with one embodiment of the present invention.

Similarly, the optical monitoring system 200 depicted in FIG. 2 can be adapted to detect the thickness of the material layer 103 and/or the remaining step height H in determining the endpoint of the second polishing process 107.

Subsequently referring to step 303 of FIG. 3, a global polishing process is performed to globally polish the planarized material layer 103 without the step height H existing between the first area 103a and the second area 103b. In some embodiments of the present invention, the global polishing process is a continuing CMP process of the second polishing process 107 utilizing the same slurry that the second polishing process 107 utilizes (such as the slurry 109).

Thereinafter, at least one subsequent process, such as a planarization process (not shown), is performed on the globally planarized surface of the material layer 103 (see FIG. 1D), meanwhile the semiconductor device 100 is completed.

In accordance with the aforementioned embodiments of the present invention, a method for planarizing a semiconductor device is provided, wherein at least two polish processes using different slurries are performed to planarize a material layer of a semiconductor device that has a first area, a second area and a step height existing therebetween, wherein the first polishing process has a first selection ratio of relative speeds for removing the material layer at the first area to that at the second area, and a second selection ratio of relative speeds for removing the material layer at the first area to that at the second area; and the second selection ratio is greater than the first selection ratio.

Since most of the material layer can be rapidly removed by the first polishing process having a lower selection ratio for removing the material layer at the first area and at the second area, respectively; and the step height existing between the first area and the second area can be reduced or lowered by the second polishing process having a higher selection ratio for removing the material layer at the first area and at the second area, respectively, thus the processing time can be significantly reduced and the end point of the planarization can be determined more easily in comparison with the traditional planarization process. Accordingly, the material layer can be globally planarized, and the performance of the subsequent process for forming the semiconductor devices can be improved.

In addition, because it is not necessary to form a polishing stop layer to determine whether the polishing process is complete, thus the processing cost can be reduced due to the omission of steps and material for forming the same.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for planarizing semiconductor devices comprising:
    forming at least one patterned metal layer on a substrate;
    providing a material layer having a first area and a second area on the at least one patterned metal layer and the substrate, wherein there is a step height existing between the first area and the second area;
    performing a first polishing process on the material layer, wherein the first polishing process has a first selection ratio of relative speeds for removing the material layer at the first area to that at the second area; and
    performing a second polishing process on the material layer, wherein the second polishing process has a second selection ratio of relative speeds for removing the material layer at the first area to that at the second area, and the second selection ratio is greater than the first selection ratio;
    wherein the second polishing process comprises a second slurry comprising a buffer reagent comprising a re-dispersible polymer.

2. The method for planarizing semiconductor devices according to claim 1, wherein the first polishing process comprises a first slurry having silicon dioxide (SiO2) ranging from 0.95% to 1.05% by weight.

3. The method for planarizing semiconductor devices according to claim 2, wherein the first selection ratio is about 1:7.

4. The method for planarizing semiconductor devices according to claim 1, wherein the second selection ratio is about 1:30.

5. The method for planarizing semiconductor devices according to claim 1, each of the first polishing process and the second polishing process comprises utilizing an optical monitoring system to determine an end-point of the first polishing process and the second polishing process, respectively.

6. The method for planarizing semiconductor devices according to claim 5, wherein the first polishing process is ended when the step height is reduced by half.

7. The method for planarizing semiconductor devices according to claim 6, wherein the second polishing process is ended when the step height is equal to 0.

8. The method for planarizing semiconductor devices according to claim 1, wherein the first polishing process is ended after performing first polishing process for a predetermined first polishing time.

9. The method for planarizing semiconductor devices according to claim 8, wherein the second polishing process is ended after performing the second polishing process for a predetermined second polishing time.

10. The method for planarizing semiconductor devices according to claim 1, wherein the material layer is a dielectric layer.

* * * * *